United States Patent [19]

Marcus

[11] 4,375,007

[45] Feb. 22, 1983

[54] SILICON SOLAR CELLS WITH ALUMINUM-MAGNESIUM ALLOY LOW RESISTANCE CONTACTS

[75] Inventor: Sanford M. Marcus, Wilmington, Del.

[73] Assignee: E. I. Du Pont de Nemours & Co., Wilmington, Del.

[21] Appl. No.: 320,590

[22] Filed: Nov. 12, 1981

Related U.S. Application Data

[62] Division of Ser. No. 210,553, Nov. 26, 1980, Pat. No. 4,347,262.

[51] Int. Cl.³ ............................................. H01L 31/06
[52] U.S. Cl. .................................. 136/256; 136/261; 357/30; 357/65
[58] Field of Search .................. 136/256, 261; 357/30, 357/65

[56] References Cited

U.S. PATENT DOCUMENTS

| | | | |
|---|---|---|---|
| 4,072,771 | 2/1978 | Grier, Sr. | 427/96 |
| 4,153,907 | 5/1979 | Kofron | 357/30 |
| 4,163,678 | 8/1979 | Bube | 136/256 |
| 4,172,919 | 10/1979 | Mitchell | 428/209 |
| 4,190,321 | 2/1980 | Dorer et al. | 350/165 |
| 4,235,644 | 11/1980 | Needes | 136/256 |
| 4,256,513 | 3/1981 | Yoshida et al. | 136/256 |
| 4,278,831 | 7/1981 | Riemer et al. | 136/256 |
| 4,336,281 | 6/1982 | van Mourik | 427/74 |

FOREIGN PATENT DOCUMENTS

1558764 1/1980 United Kingdom ................ 136/256

OTHER PUBLICATIONS

Schnable, "State of the Art in Semiconductor Materials and Processing for Microcircuit Reliability", Solid State Technology, Oct. 1978, pp. 69–73.

Merchant, "Photovoltaics: The Basics", *Solar Engineering*, Nov. 1977, pp. 30–34.

Lyman, "Thick Film, Plating Cut Cost of Laying Down Solar Cell Contacts and Conductors", *Electronics*, Sep. 11, 1980, pp. 40, 41.

*Primary Examiner*—Aaron Weisstuch

[57] ABSTRACT

An Al-Mg alloy is mixed with a Ni-Sb alloy or Al, in powder form, to form a thick-film metallizing paste useful for making low resistance electrically conductive contacts to a silicon solar cell coated with $Si_3N_4$.

4 Claims, No Drawings

SILICON SOLAR CELLS WITH ALUMINUM-MAGNESIUM ALLOY LOW RESISTANCE CONTACTS

This is a division of application Ser. No. 210,553 filed Nov. 26, 1980, now U.S. Pat. No. 4,347,262.

FIELD OF THE INVENTION

The present invention relates to the art of converting solar energy into electrical energy by means of a silicon solar cell, and more particularly to a thick-film paste composition for making low resistance contacts to such a cell.

BACKGROUND OF THE INVENTION

It is well known that radiation of an appropriate wavelength falling on a P-N junction of a semiconductor body serves as a source of external energy to generate hole-electron pairs in that body. Because of the potential difference which exists at a P-N junction, holes and electrons move across the junction in opposite directions and thereby give rise to flow of an electric current that is capable of delivering power to an external circuit. Most solar cells are in the form of a silicon wafer which has been metallized, i.e., provided with metal contacts which are electrically conductive.

To provide a low cost method of generating an electrical current from the P-N junction region of the silicon wafer, it is common practice to metallize the wafer by a screen printing and firing sequence. Commercially available metallizing inks which are employed for depositing contacts on the surface of the wafer generally contain a metal powder, a finely divided glass frit, and an organic vehicle. Typical metal powders are those of silver, aluminum, nickel, gold, or copper, or alloys of these with precious metals, including platinum and palladium.

There is extensive use of $Si_3N_4$ in solar cell technology as an anti-reflection coating, which also serves as a masking protective layer. It has good adhesion and stability when deposited on silicon. In a specific embodiment, silicon solar cells are coated with $Si_3N_4$ on the front N-type side as an anti-reflection coating, and, in the process, the back P-type side also becomes coated with $Si_3N_4$. In order to make electrical contact to the underlying silicon substrate, an etchant step must be employed. State of the art technology requires that the $Si_3N_4$ be removed where contact is made, the front side etched in pattern form for application of the front side contact, and the back side similarly etched for application generally of a large area backside contact. There would be a cost savings if this etching step could be eliminated. It has now been found that aluminum-magnesium alloys can perform this function when contained in metallizing paste formulations.

SUMMARY OF THE INVENTION

In terminating $Si_3N_4$-coated solar cells with base metal contacts such as of Ni-Sb alloys or aluminum, improvement in electrical characteristics are obtained, and the firing window, i.e., the temperature range for satisfactory firing, is widened, when 50 Al:50 Mg alloy powder is incorporated in the metallizing paste. In a specific embodiment, the invention resides in a thick-film metallizing paste for use in providing low resistance electrically conductive contacts (terminations) to a silicon solar cell coated with $Si_3N_4$, having a P-type and an N-type region, and a P/N junction, said paste comprising an organic vehicle containing, in particle form, a mixture of a major amount of a metal powder, e.g., aluminum or a Ni-Sb alloy, a minor amount of finely divided glass frits, and a small amount of a 50 Al:50 Mg alloy. The invention further resides in the process of metallizing the cell, and in the resulting product. The metallization process typically comprises screen-printing one surface of the cell with the metallizing paste of this invention and firing at a temperature of at least 500° C.

DETAILED DESCRIPTION

This application is related to copending application Ser. No. 218,493, "Solar Cell Metallizations Comprising a Nickel-Antimony Alloys" filed Dec. 19, 1980, now U.S. Pat. No. 4,342,795. The present invention is demonstrated by the Examples which follow.

EXAMPLE 1

A front surface textured silicon solar cell, constructed by applying N-type impurities 0.4 to 0.5 microns in depth into a P-type silicon wafer that had been etched to form pyramidal texture on the diffusion side, and having a $Si_3N_4$ anti-reflection coating, was metallized to provide metal contacts or terminations. The metallizing paste was screen-printed on the N surface of the wafer and was composed of an organic vehicle (ethyl cellulose/dibutyl phthalate in terpineol), NiSb alloy, glass frits, and a minor amount of a 50 Al:50 Mg alloy. Composition of the glass frits in % by wt, was PbO 83, $PbF_2$ 4.9, $B_2O_3$ 11, and $SiO_2$ 1.1. Three samples of paste were prepared, and the terminations were nitrogen-fired. The proportions of the metal components were varied, as indicated in the following tabulations:

| Paste # | NiSb | Glass | 50 Al:50Mg |
|---|---|---|---|
| 1 | 88 | 12 | 0 |
| 2 | 83 | 12 | 4.7 |
| 3 | 79 | 12 | 9.3 |

The soldered electrical characteristics of the nitrogen-fired solar cells are listed in Table I.

TABLE I

| Termination | Firing Temp °C. | $V_{oc}$ (mv) | Fill Factor | $R_{Series}$ (ohm) | $R_{shunt}$ (ohm) |
|---|---|---|---|---|---|
| 1 | 500 | — | — | Large | (Infinity) |
| 1 | 550 | 580 | 0.57 | 1.7 | " |
| 1 | 575 | 520 | 0.31 | 1.4 | " |
| 2 | 500 | 560 | — | 8.6 | " |
| 2 | 550 | 595 | 0.50 | 1.2 | " |
| 2 | 575 | 595 | 0.54 | 0.73 | " |
| 3 | 500 | 590 | — | 6.0 | " |
| 3 | 550 | 600 | 0.50 | 2.0 | " |

Table I demonstrates that the termination not containing the 50 Al:50 Mg alloy has a window with lower firing temperature near 550° C., while this window is extended downwardly to at least 500° C. when the alloy is present. Table I also demonstrates that the electrical characteristics of the solar cell, i.e., series conductivity and Voc (voltage generated across the cell when illuminated by one sun with no current flowing through cell) are enhanced when use is made of this alloy. This demonstrates that the 50 Al:50 Mg alloy was effective in penetrating the $Si_3N_4$ coating and making contact with the N-type region.

EXAMPLE II

The 50 Al:50 Mg alloy was incorporated into 2 of 3 samples of a thick-film aluminum base metallizing paste, and these were applied by screen-printing to the back P-type surface of a silicon solar cell coated with $Si_3N_4$. The resulting terminations were air-fired. Table II shows the back contact resistance in ohms of the solar cells so terminated (making use of a two-probe measurement between parallel conductor lines on the P surface of the silicon cell).

TABLE II

| Paste # | Al | 50 Al: 50 Mg | Glass | Back Contact Resistance Ohms (Air Firing Temperature) | | | |
|---|---|---|---|---|---|---|---|
| | | | | 500° C. | 550° C. | 610° C. | 650° C. |
| 1 | 81.8 | 5.8 | 12.5 | — | — | 10 | 10 |
| 2 | 87.5 | 0 | 12.5 | — | — | 50M–100M[1] | 500K[2]–1M |
| 3 | 66.3 | 8.8 | 25.0 | — | — | 52 | 50 |

[1]M = 1 million
[2]K = 1,000

It is evident from Table II that there is a significant reduction in contact resistance of formulations to which 50 Al:50 Mg had been added, compared to that where the 50 Al:50 Mg was absent.

The foregoing Examples are illustrative only. It is to be understood that other vehicles, other metal powders, other glass frit compositions and other Ai:Mg alloys may be employed, to the extent that they function to form a thick-film metallization paste for use in providing low resistance electrically conductive contacts to a silicon solar cell coated with $Si_3N_4$. While screen printing is disclosed above, other methods of application to the substrate such a brushing, spraying, stamping, etc. could be used. The organic vehicle employed in the printing paste is generally employed in an amount such that the printing paste will contain 70–90% solids and 10–30% vehicle. A number of inert liquid vehicles commonly used in the art are described in greater detail in U.S. Pat. No. 4,172,919, column 4, lines 3–28, which lines are incorporated by reference herein.

I claim:

1. A silicon solar cell coated with $Si_3N_4$ having a P-type and an N-type region and a P-N junction, the N surface of which has been metallized by (1) screen-printing thereon a thick film paste comprising a mixture of finely divided particles of a major amount of a metal powder, a minor amount of glass frits and a small amount of a 50 Al:50 Mg alloy, dispersed in an organic vehicle, and (2) firing the printed surface at a temperature of at least 500° C. to form electrically conductive contacts thereon.

2. A silicon solar cell coated with $Si_3N_4$ having a P-type and an N-type region and a P-N junction, the P surface of which has been metallized by (1) screen-printing thereon a thick film paste comprising a mixture of finely divided particles of a major amount of a metal powder, a minor amount of glass frits and a small amount of a 50 Al:50 Mg alloy, dispersed in an organic vehicle, and (2) firing the printed surface at a temperature of at least 600° C. to form electrically conductive contacts thereon.

3. The solar cell of either claim 1 or 2 in which the metal powder is aluminum.

4. The solar cell of either claim 1 or 2 in which the metal powder is NiSb alloy.

* * * * *